US012805244B2

(12) United States Patent
Kim et al.

(10) Patent No.: US 12,805,244 B2
(45) Date of Patent: Nov. 17, 2026

(54) FLAT SUBSTRATE HEATING APPARATUS USING LASER LIGHT-EMITTING DEVICE

(71) Applicant: Viatron Technologies, Inc., Gyeonggi-do (KR)

(72) Inventors: Hyoung June Kim, Seoul (KR); Byung Kuk Kim, Gyeonggi-do (KR); Wang Jun Park, Gyeonggi-do (KR); Jin Hong Lee, Gyeonggi-do (KR); Nam Chun Lee, Gyeonggi-do (KR)

(73) Assignee: Viatron Technologies, Inc., Gyeonggi-do (KR)

( * ) Notice: Subject to any disclaimer, the term of this patent is extended or adjusted under 35 U.S.C. 154(b) by 656 days.

(21) Appl. No.: 18/270,610

(22) PCT Filed: Dec. 30, 2021

(86) PCT No.: PCT/KR2021/020276
§ 371 (c)(1),
(2) Date: Jun. 30, 2023

(87) PCT Pub. No.: WO2022/146075
PCT Pub. Date: Jul. 7, 2022

(65) Prior Publication Data

US 2024/0071788 A1 Feb. 29, 2024

(30) Foreign Application Priority Data

Dec. 31, 2020 (KR) ........................ 10-2020-0188947

(51) Int. Cl.
*H10P 72/00* (2026.01)
*H01S 5/02315* (2021.01)
(Continued)

(52) U.S. Cl.
CPC ...... *H10P 72/0436* (2026.01); *H01S 5/02315* (2021.01); *H01S 5/02423* (2013.01);
(Continued)

(58) Field of Classification Search
CPC .. H05B 2203/025; H05B 3/0047; H05B 3/03; H05B 3/00; H01S 5/02315;
(Continued)

(56) References Cited

U.S. PATENT DOCUMENTS 10,477,732 B2 * 11/2019 Murata ...................... B41J 2/01
2019/0207357 A1 7/2019 Cheng et al.

FOREIGN PATENT DOCUMENTS

JP 2005-268650 9/2005
JP 2016-207839 12/2016
(Continued)

OTHER PUBLICATIONS

International Search Report mailed Apr. 11, 2022 for PCT/KR2021/020276, 5 pages.
(Continued)

*Primary Examiner* — Woody A Lee, Jr.
*Assistant Examiner* — Adam M Eckardt

(57) ABSTRACT

The present disclosure discloses a flat substrate heating apparatus including a module support plate having a plurality of unit module regions placed on an upper surface thereof; a plurality of laser light source modules having a plurality of laser light source devices and seated on unit module regions of the module support plate, respectively; a power supply board placed below the module support plate and configured to supply power to the laser light source module; and an electrode terminal electrically connecting the laser light source module and the power supply board while detachably securing them to upper and lower surfaces of the module support plate.

7 Claims, 5 Drawing Sheets

(51) Int. Cl.
*H01S 5/024* (2006.01)
*H05B 3/00* (2006.01)
*H05B 3/03* (2006.01)

(52) U.S. Cl.
CPC ............. *H05B 3/0047* (2013.01); *H05B 3/03* (2013.01); *H05B 2203/025* (2013.01)

(58) Field of Classification Search
CPC ...... H01S 5/02423; H01S 5/183; H01S 5/024; H10P 72/00; H10P 72/0436
See application file for complete search history.

(56) References Cited

FOREIGN PATENT DOCUMENTS

| | | | | | |
|---|---|---|---|---|---|
| JP | 2016207839 | A | * | 12/2016 | |
| KR | 10-2018-0077384 | | | 7/2018 | |
| KR | 10-2020-0082699 | | | 7/2020 | |
| KR | 20200082699 | A | * | 7/2020 | ............. H01S 5/023 |

OTHER PUBLICATIONS

Office Action dated Apr. 29, 2022 corresponding to Korean Patent Application No. 10-2020-0188947, 5 pages.

* cited by examiner

FLAT SUBSTRATE HEATING APPARATUS USING LASER LIGHT-EMITTING DEVICE

This application claims the priority of Korean Patent Application No. 10-2020-0188947, filed on Dec. 31, 2020 in the KIPO (Korean Intellectual Property Office), the disclosure of which is incorporated herein entirely by reference. Further, this application is the National Stage application of International Application No. PCT/KR2021/020276, filed on Dec. 30, 2021, which designates the United States and was published in Korean. Each of these applications is hereby incorporated by reference in their entirety into the present application.

TECHNICAL FIELD

The present disclosure relates to a flat substrate heating apparatus for heating a flat substrate, such as a semiconductor wafer or a glass substrate, using a laser light-emitting device.

BACKGROUND ART

A flat substrate such as a semiconductor wafer or a glass substrate may undergo a heat treatment process such as a silicon thin film crystallization process, an ion implantation process, and an activation process. The above heat treatment process is generally carried out using a halogen lamp-heating apparatus including a halogen lamp as a light source.

The halogen lamp-heating apparatus has a structure by which light is irradiated to a front or rear surface of a flat substrate and the light is irradiated back to the flat substrate using a reflector. Therefore, the halogen lamp-heating apparatus has a drawback in that a flash lamp arrangement structure and a reflector structure become complicated in order to increase the temperature uniformity of the flat substrate. In addition, the halogen lamp-heating apparatus has the aspect that the maintenance cost for the apparatus is increased due to the short lifespan of the halogen lamp.

Recently, a flat substrate heating apparatus using a VCSEL (vertical cavity surface emitting laser) has been developed. The flat substrate heating apparatus using the VCSEL is formed such that a VCSEL module including a plurality of VCSELs is arranged in a planar shape to irradiate a laser beam to a large-area region. The flat substrate heating apparatus using the VCSEL needs to independently supply power to each VCSEL module, so the number of power lines is increased and wiring becomes complicated. In addition, the flat substrate heating apparatus using the VCSEL has a problem that it is difficult to separate the VCSEL module and the power line when one of the VCSELs is broken. Also, the flat substrate heating apparatus using the VCSEL needs to supply coolant to each VCSEL module, but a coolant supply structure may be complicated because of the power line. Furthermore, the flat substrate heating apparatus using the VCSEL has a problem in that the number of power lines per unit area and the number of structural components is increased, which takes a lot of time to execute repair.

DISCLOSURE OF THE INVENTION

Technical Problem

An object of the present disclosure is to provide a flat substrate heating apparatus having a simple structure and performing efficient maintenance, due to the reduced number of power lines and components.

Technical Solution

The flat substrate heating apparatus of the present disclosure includes a module support plate having a plurality of unit module regions placed on an upper surface thereof; a plurality of VCSEL modules each having a plurality of laser light source devices and being seated on unit module regions of the module support plate, respectively; a power supply board placed below the module support plate and configured to supply power to each VCSEL module; and an electrode terminal electrically connecting each VCSEL module and the power supply board while detachably securing them to upper and lower surfaces of the module support plate.

In addition, each VCSEL module may comprise a device substrate having a device region and a terminal region, and having a device terminal hole penetrating the terminal region from an upper surface to a lower surface, a VCSEL device arranged on the device region of the device substrate, a terminal pad formed in a ring shape along an outer diameter of an upper end of the device terminal hole, and a cooling block placed below the device substrate and having a block terminal hole.

Also, the module support plate includes a support main plate having a support terminal hole formed at a position corresponding to the device terminal hole, of each unit module region, the power supply board has a power terminal hole formed at a position corresponding to the support terminal hole, and the electrode terminal may include an upper terminal bolt passing through the device terminal hole and the block terminal hole to be inserted into an upper portion of the support terminal hole, a lower terminal bolt passing through the power terminal hole to be inserted into a lower portion of the support terminal hole, and a connecting nut placed inside the support terminal hole and screw-coupled with the upper terminal bolt and the lower terminal bolt.

Furthermore, the upper terminal bolt is electrically connected to the terminal pad, and the lower terminal bolt may be electrically connected to the power supply board.

In addition, the electrode terminal may further include an insulating tube placed between an inner circumferential surface of the support terminal hole and an outer circumferential surface of the connecting nut.

Also, the support main body plate has a support coolant hole formed by penetrating the support main body plate from an upper surface to a lower surface thereof, the module support plate further includes a support lower protrusion formed from a lower portion of the support coolant hole to a lower portion of the support main body plate and having a protrusion coolant hole in communication with the support coolant hole, the cooling block further includes a block cooling flow passage connected to the support coolant hole, and coolant for cooling the VCSEL device may flow through the protrusion coolant hole, the support coolant hole and the block cooling flow passage.

Furthermore, the flat substrate heating apparatus further includes a coolant supply module coupled to the support lower protrusion to supply coolant to the protrusion coolant hole, the coolant supply module includes a coolant supply main body having a planar shape corresponding to the module support plate, a coolant inflow pipe for supplying coolant to the coolant supply main body, and a coolant outflow pipe for outflowing coolant from the coolant supply main body, the coolant supply main body includes at least one pair of main body internal flow passages extending therein in a direction in which each VCSEL module is arranged, at least one pair of main body upper flow passages formed by penetrating the coolant supply main body from the main body internal flow passage to an upper surface of the coolant supply main body and connected to the protrusion coolant hole, and one pair of main body lower flow passage formed by penetrating the coolant supply main body from the main body internal flow passage to a lower surface of the coolant supply main body, and the coolant inflow pipe and the coolant outflow pipe may be coupled to one pair of main body lower flow passages, respectively.

In addition, the coolant supply main body is formed to be divided into a plurality of unit supply main bodies, and each unit supply main body may include the main body internal flow passage, the main body upper flow passage and the main body lower flow passage.

Furthermore, the coolant supply main body may further include a main body connecting flow passage connecting the main body internal flow passages when the main body internal flow passage is formed in a plurality of pairs.

Advantageous Effects

In the flat substrate heating apparatus of the present disclosure, since each VCSEL module is secured to the modular electrode substrate by using the electrode terminals which can be detached from above or below, it is possible to detach the broken-down VCSEL module more easily.

In the flat substrate heating apparatus of the present disclosure, power is supplied to each VCSEL module by using the electrode terminals and the power supply board, and thus there is no need to arrange power lines, whereby maintenance can be carried out efficiently.

Also, in the flat substrate heating apparatus of the present disclosure, since coolant is supplied to each VCSEL module through the support coolant hole and the protrusion coolant hole formed independently in the module support plate formed of metal, the coolant supply flow passage is simplified and maintenance can be performed efficiently.

In addition, in the flat substrate heating apparatus of the present disclosure, since the flow passage for supplying coolant to each VCSEL module is formed, it is possible to independently easily detach the broken-down VCSEL module.

BEST MODE FOR CARRYING OUT THE INVENTION

Hereinafter, a flat substrate heating apparatus using a laser light-emitting device of the present disclosure is described in more detail with reference to embodiments and accompanying drawings.

First, a configuration of a flat substrate heating apparatus using a laser light-emitting device according to one embodiment of the present disclosure is described.

Figure 1:
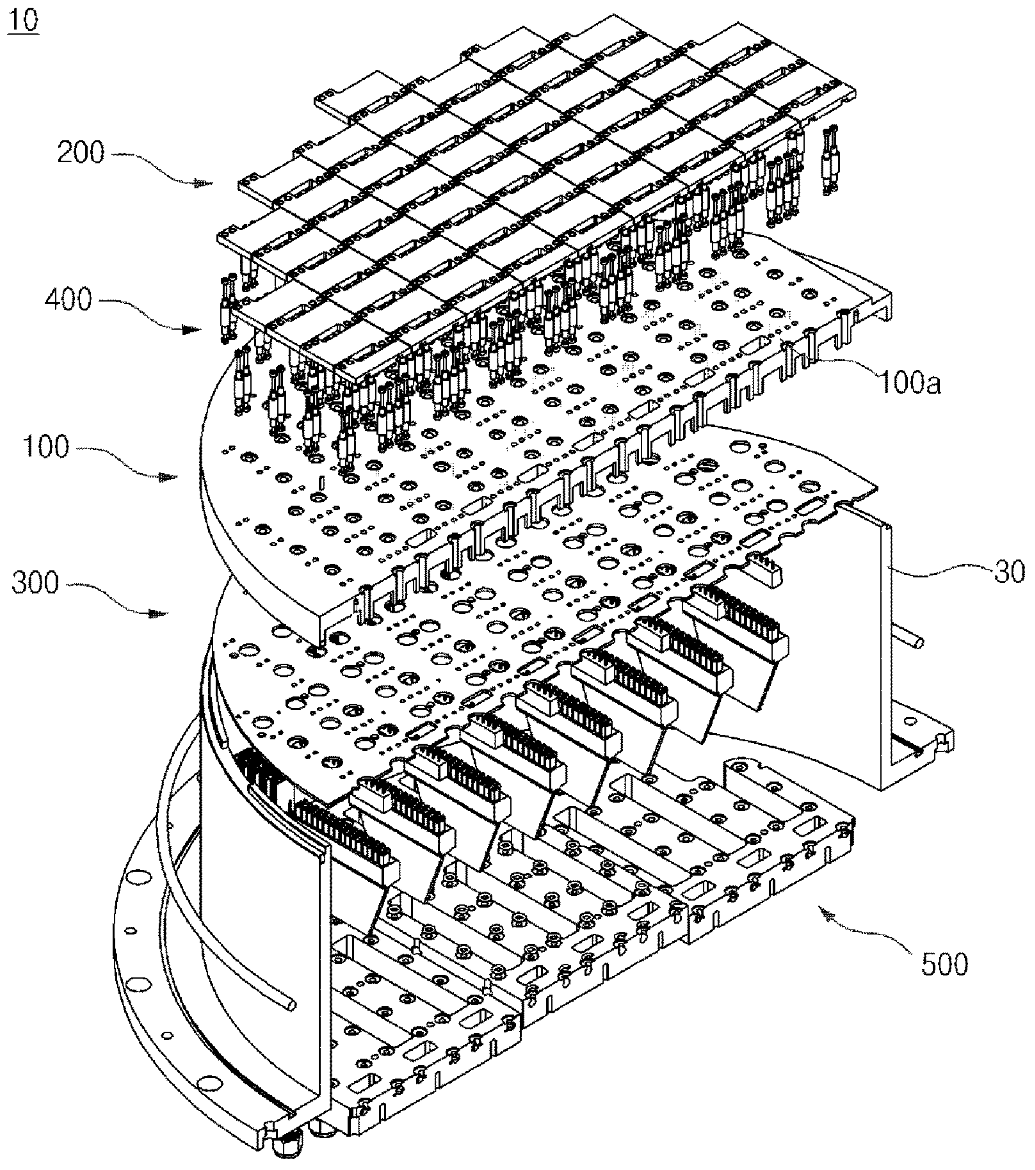
FIG. 1 is an exploded perspective view of a flat substrate heating apparatus using a laser light-emitting device according to one embodiment of the present disclosure.
Figure 2:
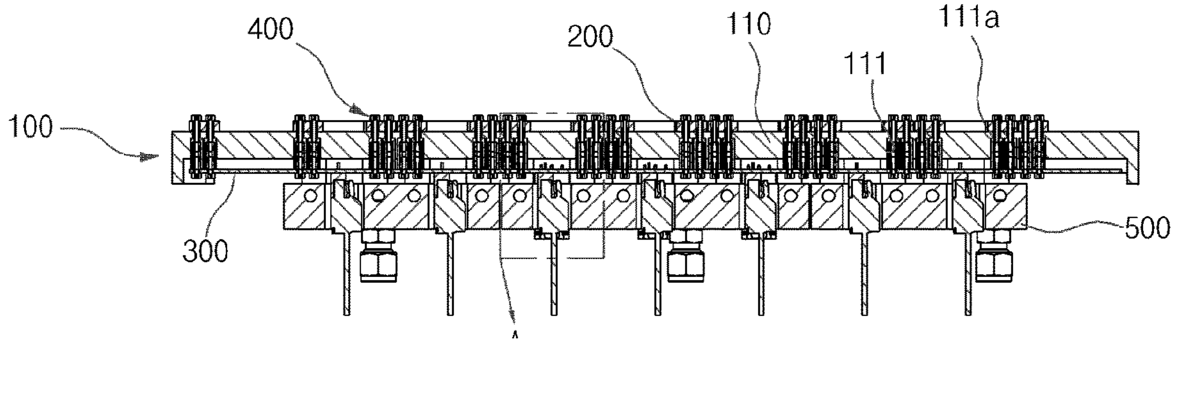
FIG. 2 is a vertical cross-sectional view of a state in which the flat substrate heating apparatus of FIG. 1 is coupled.
Figure 3:
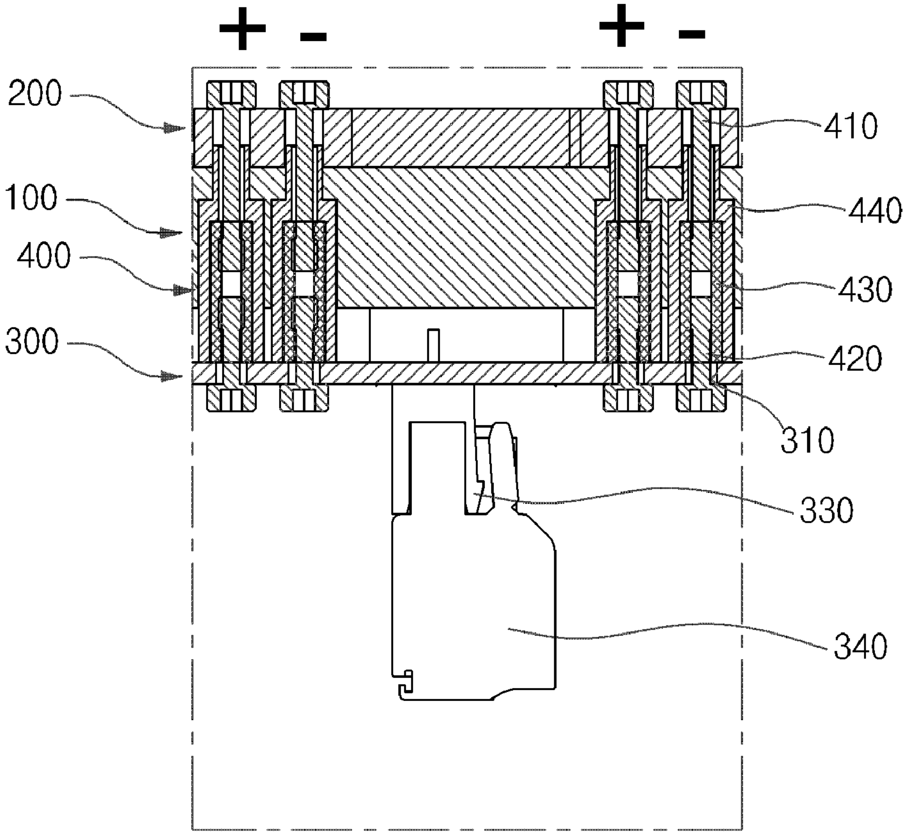
FIG. 3 is a partially enlarged view of "A" section in FIG. 2.
Figure 4:
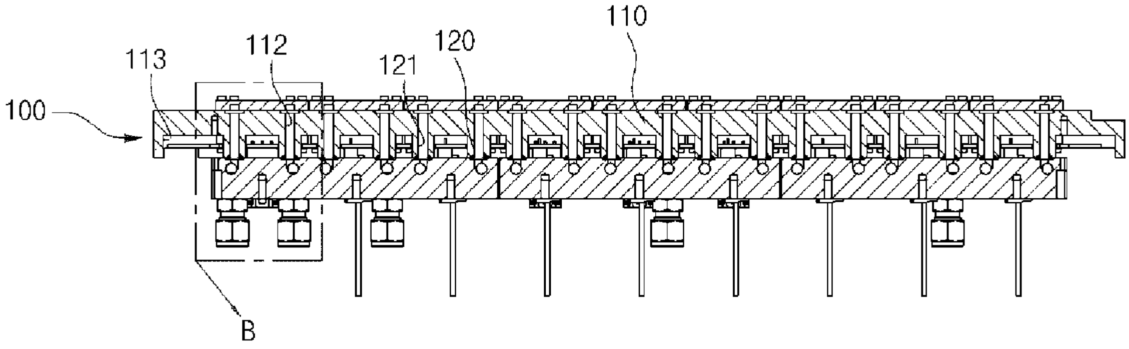
FIG. 4 is a vertical cross-sectional view of another position in a state in which the flat substrate heating apparatus of FIG. 1 is coupled.
Figure 5:
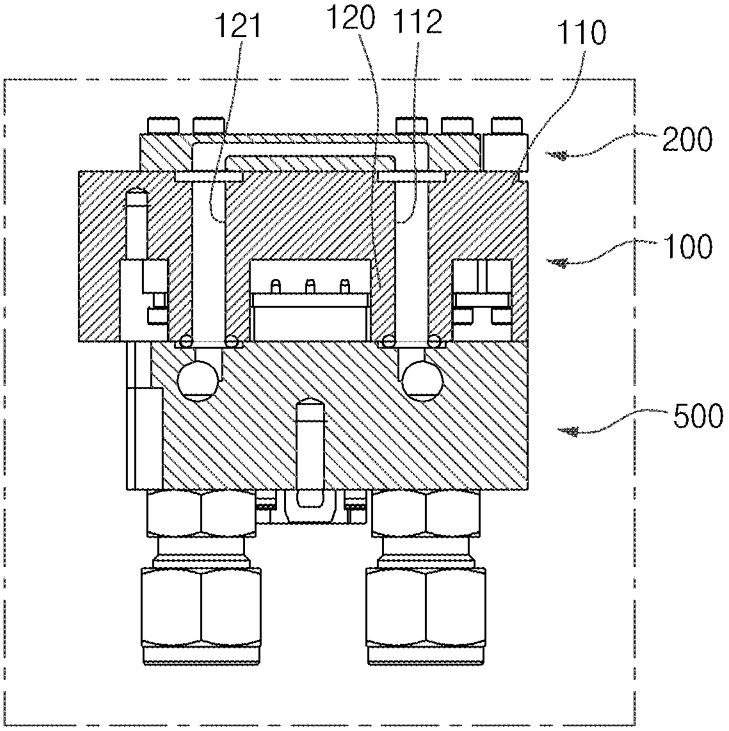
FIG. 5 is a partially enlarged vertical cross-sectional view of "B" section in FIG. 4.
Figure 6:
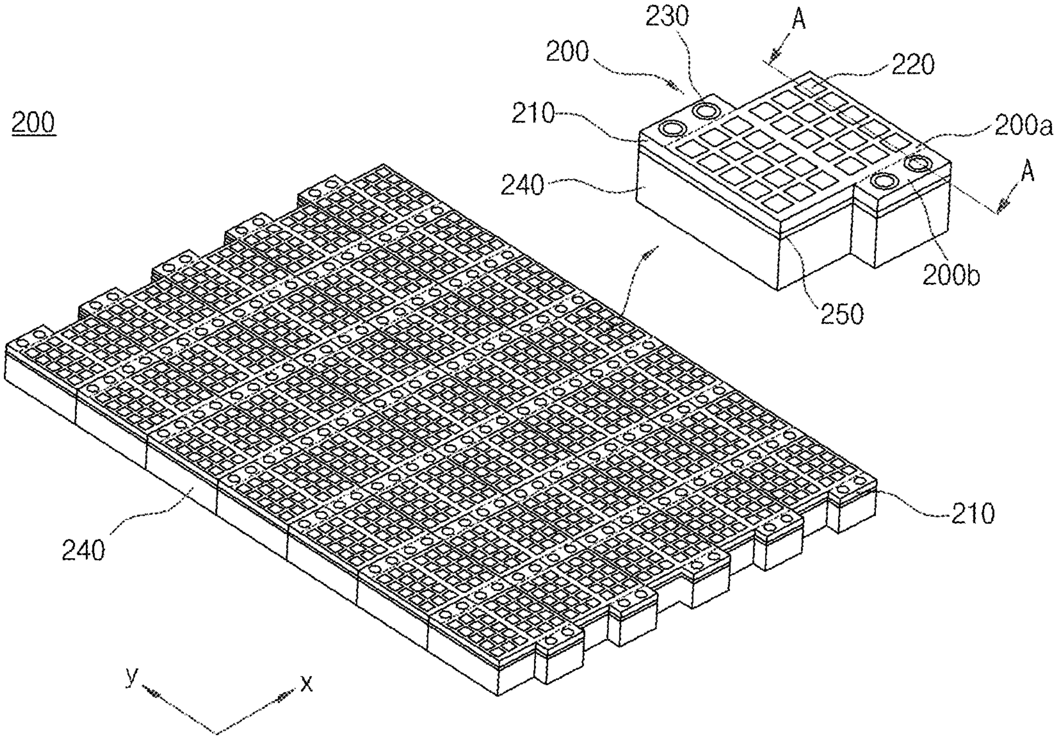
FIG. 6 is a partial perspective view of a VCSEL module of FIG. 1.
Figure 7:
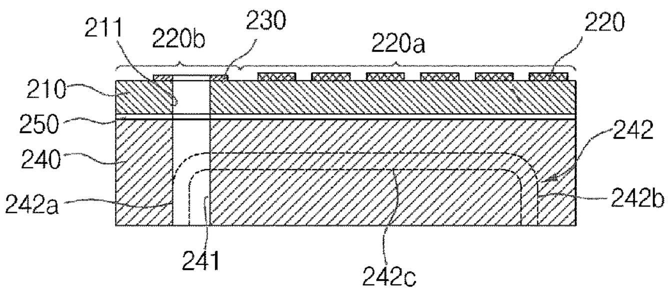
FIG. 7 is a vertical cross-sectional view of a VCSEL device of FIG. 6 taken along line "A-A".
Figure 8:
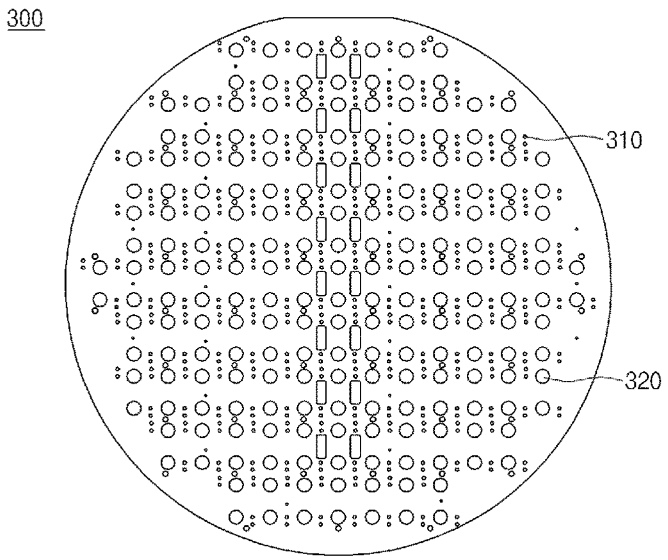
FIG. 8 is a plan view of a power supply board of FIG. 1.
Figure 9:
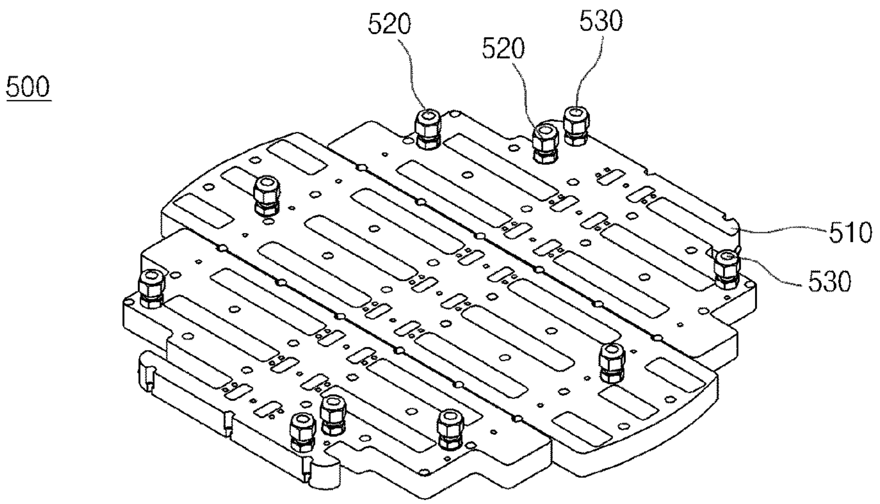
FIG. 9 is a bottom perspective view of a coolant supply module of FIG. 1.
Figure 10:
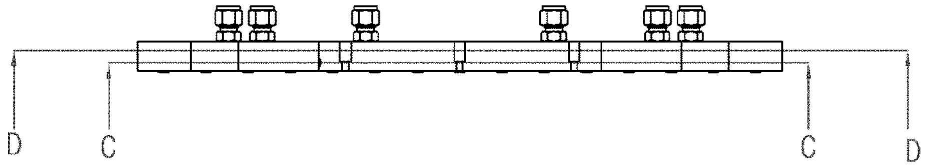
FIG. 10 is a side view of a coolant supply module of FIG. 9.
Figure 11:
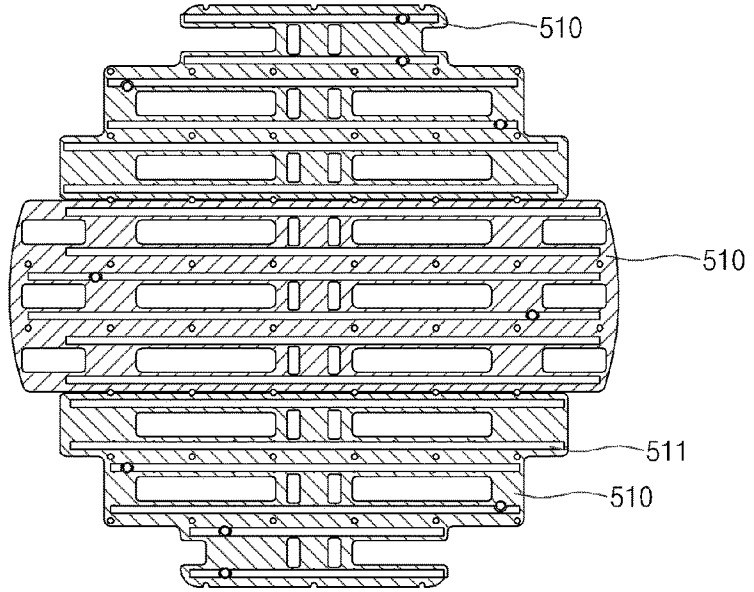
FIG. 11 is a horizontal cross-sectional view taken along line "C-C" in FIG. 10.
Figure 12:
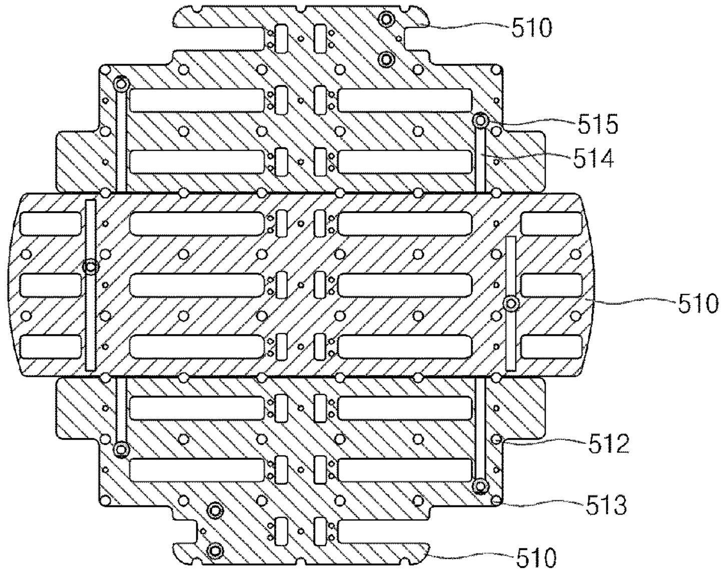
FIG. 12 is a horizontal cross-sectional view taken along line "D-D" in FIG. 10.

FIG. 1 is an exploded perspective view of a flat substrate heating apparatus using a laser light-emitting device according to one embodiment of the present disclosure. FIG. 2 is a vertical cross-sectional view of a state in which the flat substrate heating apparatus of FIG. 1 is coupled. FIG. 3 is a partially enlarged view of "A" section in FIG. 2. FIG. 4 is a vertical cross-sectional view of another position in a state in which the flat substrate heating apparatus of FIG. 1 is coupled. FIG. 5 is a partially enlarged vertical cross-sectional view of "B" section in FIG. 4. FIG. 6 is a partial perspective view of a VCSEL module of FIG. 1. FIG. 7 is a vertical cross-sectional view of a VCSEL device of FIG. 6 taken along line "A-A". FIG. 8 is a plan view of a power supply board of FIG. 1. FIG. 9 is a bottom perspective view of a coolant supply module of FIG. 1. FIG. 10 is a side view of a coolant supply module of FIG. 9. FIG. 11 is a horizontal cross-sectional view taken along line "C-C" in FIG. 10. FIG. 12 is a horizontal cross-sectional view taken along line "D-D" in FIG. 10.

Referring to FIGS. 1 to 12, a flat substrate heating apparatus 10 according to one embodiment of the present disclosure includes a module support plate 100, a VCSEL module 200, a power supply board 300, an electrode terminal 400, and a coolant supply module 500.

Meanwhile, reference numeral 30 in FIG. 1 denotes an inner housing for supporting the flat substrate heating apparatus while forming a heat treatment chamber in a heat treatment apparatus including the flat substrate heating apparatus.

In the flat substrate heating apparatus 10, the VCSEL module 200 is placed above the module support plate 100, and the power supply board 300 is placed below the module support plate 100. In addition, in the flat substrate heating apparatus 10, the VCSEL module 200 and the power supply board 300 are physically secured to the module support plate 100 by the electrode terminals 400. In the flat substrate heating apparatus 10, at this time, the VCSEL module 200 and the power supply board 300 are electrically connected to each other while being secured at upper and lower portions of the module support plate 100, respectively by the electrode terminals 400.

Accordingly, in the flat substrate heating apparatus 100, power is supplied from the power supply board 300 to the VCSEL module 200 through the electrode terminal 400. In addition, in the flat substrate heating apparatus 10, it is possible to separate the VCSEL module 200 from the module support plate 100 by separating the electrode terminal 400.

The flat substrate heating apparatus 10 may irradiate a laser beam generated from the VCSEL module 200 to a flat substrate placed thereabove to heat the flat substrate. Here, the flat substrate may be a semiconductor wafer or a glass substrate. Also, the flat substrate may be a flexible substrate such as a resin film. In addition, the flat substrate may include various devices or electrically conductive patterns formed thereon or therein.

The flat substrate heating apparatus 10 may be applied to a heating apparatus in which a manufacturing process, such as a silicon thin film crystallization process, an ion implantation process, or an activation process for a flat substrate is carried out.

The module support plate 100 may include a support main body plate 110 and a support lower protrusion 120. The module support plate 100 may be formed in a circular plate shape or a rectangular plate shape. The module support plate 100 may be formed in a circular plate shape when the flat substrate is a semiconductor wafer. In addition, when the flat substrate is a glass substrate, the module support plate 100 may be formed in a rectangular plate shape.

The module support plate 100 may be divided into a plurality of unit module regions 100*a*. The unit module region 100*a* is a region on which each VCSEL module 200 is seated. The unit module regions 100*a* may be positioned adjacent to each other in a lattice arrangement. Accordingly, the plurality of unit module regions 100*a* may be displaced adjacent to each other in a longitudinal direction and a width direction.

The support main body plate 110 may include a support terminal hole 111 and a support coolant hole 112. In addition, the support main body plate 110 may further include a substrate support groove 113. The support main body plate 110 may be formed in a circular plate shape having a predetermined thickness. In addition, the support main body plate 110 may be formed of a metal material having mechanical strength and thermal conductivity. For example, the support main body plate 110 may be formed of stainless steel or aluminum. The support main body plate 110 may be divided into the plurality of unit module region 100*a*. Since each VCSEL module 200 is placed at each unit module region 100*a*, the electrode terminals 400 may be inserted into the pair of support terminal holes 111, respectively. Here, the electrode terminals 400 may be a positive terminal and a negative terminal.

The support terminal hole 111 may be formed by penetrating the support body plate 110 from an upper surface to a lower surface thereof. The support terminal holes 111 may be formed in pairs in each unit module region 100*a*. That is, two support terminal holes 111 may be formed in pairs. The support terminal holes 111 may be formed in an appropriate number of pairs according to a structure of the VCSEL module 200. For example, the support terminal holes 111 may be formed in one pair or two pairs in the unit module region 100*a*. When formed in two or more pairs, the support terminal holes 111 may be positioned in the unit module region 100*a* to be spaced apart from each other in the width direction or a diagonal direction.

The support terminal hole 111 may include an insulating support ring 111*a*. The insulating support ring is formed in a ring shape protruding inward from an upper portion of the support terminal hole 111. An inner diameter of the insulating support ring 111*a* is smaller than an inner diameter of the support terminal hole 111.

The support coolant hole 112 is formed by penetrating the support main body plate from the upper surface to the lower surface thereof. At least two support coolant holes 112 are positioned in the unit module region 100*a* to be spaced apart from each other. The support coolant hole 112 is a passage through which coolant for cooling the VCSEL module 200 placed thereabove flows.

The substrate support groove 113 is formed to have a predetermined depth from the lower surface of the support body plate 110 in an upward direction. The plurality of the substrate support grooves 113 may be dispersedly formed in the support body plate 110. The substrate support groove 113 may provide a passage to which a substrate securing bolt for securing the power supply board 300 to the module support plate 100 is coupled.

The support lower protrusion 120 is formed in a ring shape with a predetermined height from the lower surface of the support body plate 110 at a position of the support coolant hole 112. The support lower protrusion 120 may be integrally formed with the support main body plate 110. The support lower protrusions 120 are formed in pairs, wherein one of which provide a passage into which coolant flows, and the other one may provide a passage through which coolant flows out.

The support lower protrusion 120 has a protrusion coolant hole 121 that is extended vertically inside the support lower protrusion 120 and passes through the support coolant hole 112. The protrusion coolant hole 121 may be formed to have the same diameter as the support coolant hole 112. The protrusion coolant hole 121 together with the support coolant hole 112 provides a passage through which coolant flows. Accordingly, the protrusion coolant hole 121 may provide a passage into which coolant flows and a passage through which coolant flows out, respectively.

The VCSEL module 200 may include a device substrate 210, VCSEL devices 220, a terminal pad 230, and a cooling block 240. Instead of the VCSEL device 220, meanwhile, the VCSEL module 200 may be formed of a laser light source device that irradiates the laser beam. In this case, the VCSEL module 200 may be referred to as a laser light source module. Therefore, the present disclosure utilizes the concept that the VCSEL module 200 and the VCSEL device 220 include a laser light source module and a laser light source device, respectively. In addition, the laser light source device may include a surface light-emitting device or an edge light-emitting device.

The plurality of the VCSEL modules 200 may be arranged and displaced on the upper surface of the module support plate 100 in a grid direction. On the upper surface of the module support plate 100, the VCSEL modules 200 may be placed in the unit module regions 100*a*, respectively. The VCSEL module 200 may irradiate the laser beam emitted from the VCSEL device 220 to the flat substrate. The VCSEL module 200 may be arranged in a region required to irradiate the laser beam to an irradiation region of the flat substrate which is being heated. The VCSEL module 200 may be formed to have various areas and shapes according to the area and shape of the irradiation region. In addition, the VCSEL module 200 may be formed to have an appropriate area and shape according to the number thereof to be used.

On the other hand, here, referring to the illustration of FIG. 2, the x direction is expressed in one side and the other side or one end and the other end, and the y direction is expressed in a front side and a rear side, or a front end and a rear end. In addition, the x direction is expressed in a width or a width direction, and the y direction is expressed in a length or a length direction.

The VCSEL module 200 may include a device region 200*a* on which the VCSEL device 220 is mounted and a terminal region 200*b* to which the electrode terminal 400 is coupled. In the VCSEL module 200, the device region 200*a* and the terminal region 200*b* may be arranged in various shapes and positions according to a planar shape and a structure disposed on the module support plate 100. For example, the device region 200*a* may be formed in a quadrangular shape, and the terminal regions 200*b* may be formed to protrude from the other side of a front end and one side of a rear end of the device region 200*a*, respectively. The terminal regions 200*b* may be formed on a half region in the other side direction at the front end of the device region 221*a* and on a half region in one side direction at the rear end of the device region 221*a*, respectively. That is, the terminal region 200*b* may be formed to have a width corresponding to half of the width of the device region 200*a*.

In addition, when the VCSEL module 200 is arranged on the module support plate 100 in the y-axial direction, the terminal region 200*b* positioned at the other side of the front end and the terminal region 200*b* positioned at one side of the rear end of the adjacent VCSEL module 200 may be placed adjacent to each other in the x-axial direction. In the sub-irradiation module 220, the device regions 200*a* and the terminal regions 200*b* may be linearly arranged in the x-axial direction, respectively, and the device regions 200*a* and the terminal regions 200*b* may be alternately arranged in the y-axial direction. The sub-irradiation modules 220 may be disposed such that a pitch between the sub-irradiation modules 220 adjacent to each other in the y-axial direction and the x-axial direction is minimized. In addition, the sub-irradiation modules 220 may be arranged to have a pitch therebetween of up to 2 mm.

In the VCSEL module 200, the VCSEL devices 220 may be arranged on the device region 200*a* in the x-axial direction and the y-axial direction to be arranged in a lattice shape. In addition, in the VCSEL module 200, electrode pads are placed on the terminal region 200*b*. In the VCSEL module 200, the electrode pad and the VCSEL device 220 are electrically connected to each other, and it is possible to supply the power from the electrode pad to the VCSEL device 220. In the VCSEL module 200, although not specifically illustrated, the electrode pad and the VCSEL device 220 may be electrically connected to each other by a plurality of electrically conductive patterns provided on the device substrate 210.

The device substrate 210 may be formed of a general substrate used to mount electronic devices. For example, the device substrate 210 may be a PCB substrate or a ceramic substrate. The device substrate 210 may be divided into the device region 200*a* on which the VCSEL device 220 is mounted and the terminal area 200*b* on which the terminal pad 230 is placed. Here, the device region 200*a* and the terminal region 200*b* have the same concept as the device region 200*a* and the terminal region 200*b* of the VCSEL module 200 described above.

The device substrate 210 may have a device terminal hole 211. The device terminal hole 211 may be formed by penetrating the terminal region 200*b* of the device substrate 210 from an upper surface to a lower surface. The device terminal hole 211 may be in communication with the support terminal hole 111 of the module support plate 100. The device terminal holes 211 may be formed in one pair and spaced apart from each other in one terminal area 200*b*. The device terminal hole 211 may include the device terminal hole 211 through which a positive electrode terminal passes and the device terminal hole 211 through which a negative electrode terminal passes.

The VCSEL device 220 may be formed of a general VCSEL device 220 irradiating a laser beam. For example, the VCSEL device 220 may be a device oscillating a surface-emitting laser. The VCSEL device 220 may be formed to have a quadrangular planar shape, preferably a square shape or a rectangular shape in which the ratio of width to length does not exceed 1:2. The VCSEL device 220 is manufactured of a cubic-shaped chip, and a high-power laser beam is oscillated from one surface. Since the VCSEL device 220 oscillates a high-power laser beam, compared to the conventional halogen lamp, this device can heat the flat substrate efficiently and has a relatively long lifespan.

On the device region 200*a*, the plurality of the VCSEL devices 220 may be arranged on the upper surface of the device substrate 220 in the x-direction and the y-direction to be arranged in a lattice shape. An appropriate number of the VCSEL devices 220 may be placed at appropriate intervals according to the area of the device region 200*a* and the amount of energy of a required laser beam. In addition, the VCSEL devices 220 may be placed at an interval by which uniform energy may be irradiated when a laser beam emitted from one VCSEL device overlaps a laser beam of the adjacent VCSEL device 220.

The terminal pad 230 may be formed as a ring-shaped pad along an outer diameter of an upper end of the device terminal hole 211 formed in the terminal region 200*b* of the device substrate 210. In each terminal region 200*b*, accordingly, the terminal pads 230 may correspond to the device terminal holes 211, thereby being formed in one pair. The terminal pad 230 may be used as a + terminal pad 230 and a − terminal pad 230. The terminal pad 230 may be electrically connected to the VCSEL devices 220, 222. As mentioned above, the terminal pad 230 is electrically connected to the electrically conductive pattern formed on the upper surface of the device substrate 210, and may be electrically connected to the VCSEL device 220. The terminal pad may supply the power necessary for driving the VCSEL device 220. The terminal pad 230 may be formed of a general pad formed on the substrate. The terminal pad 230 may be formed of a metal such as copper, having excellent electrical conductivity.

The cooling block 240 may include a block terminal hole 241 and a block cooling flow passage 242. The cooling block 240 may be formed to have a planar shape, corresponding to a planar shape of the device substrate 210, and a predetermined height. The cooling block 240 may be formed of a ceramic or a metal material having thermal conductivity. The cooling block 240 may be coupled to the lower surface of the device substrate 210 by a separate adhesive layer 250. The cooling block 240 may radiate heat, which is generated from the VCSEL device 220 mounted on the device substrate 210, downward. Thus, the cooling block 240 may cool the device substrate 210 and the VCSEL device 220.

The block terminal hole 241 may be formed by penetrating the cooling block 240 from an upper surface to a lower surface thereof. The block terminal hole 241 may be formed at a position corresponding to the device terminal hole 211 of the device substrate 210. Accordingly, the block terminal holes 241 are formed in one pair in the terminal region 200*b* and may be in communication with the device terminal holes 211, respectively. The block terminal hole 241 may provide a passage through which the electrode terminal 400 passes. That is, the block terminal holes 241 may provide passages through which the positive electrode terminal and the negative electrode terminal pass.

The block cooling flow passage 242 may be composed of a block inlet 242*a* and a block outlet 242*b* formed in a lower surface of the cooling block 240, and various shaped block internal flow passage 242*c* formed inside the cooling block 240. For example, the block cooling flow passage 242 may include two vertical flow passages extending upward from the lower surface and one horizontal flow passage connecting the vertical flow passages. The block cooling flow passage 242 may be formed to have "∩"-shaped vertical cross section. Two or more block cooling flow passages 242 may be formed depending on a size of the cooling block 240.

The power supply board 300 may include a power terminal hole 310 and a power protrusion hole 320. The power supply board 300 may further include a fixed connector 330 and a connecting connector 340. Although not specifically illustrated, various electrically conductive patterns for supplying the power may be formed on upper and lower surfaces of the power supply board 300.

The power supply board 300 may be formed in a planar shape corresponding to the shape of the module support plate 100. The power supply board 300 may be formed of a conventional board. For example, the power supply board 300 may be formed of a printed circuit board (PCB) or a ceramic board. The power supply board 300 is placed below the module support plate 100, is electrically connected to the VCSEL module 200 through the electrode terminal 400, and may supply the power to the VCSEL device 220.

The power terminal hole 310 is formed by penetrating the power supply board 300 from the upper surface to the lower surface. The power terminal hole 310 is formed at a position that corresponds to the support terminal hole 111 of the module support plate 100 when the power supply board 300 is coupled to a lower portion of the module support plate 100. Thus, the power terminal hole 310 may be in communication with the support terminal hole 111. The power terminal holes 310 may correspond to the support terminal holes 111, thereby being formed in one pair.

The power terminal hole 310 may provide a passage through which the electrode terminal 400 passes. Accordingly, the power terminal hole 310 may be formed with an inner diameter corresponding to an outer diameter of the electrode terminal 400. One of the power terminal holes 310 may allow a positive electrode terminal to pass therethrough and the other may allow a negative electrode terminal to pass therethrough.

The power protrusion hole 320 is formed by penetrating the power supply board 300 from the upper surface to the lower surface. The power protrusion hole 320 is formed at a position corresponding to a position of the support lower protrusion 120 of the module support plate 100 when the power supply board 300 is coupled to the lower portion of the module support plate 100. Accordingly, the power protrusion hole 320 may provide a passage through which the support lower protrusion 120 passes. The power protrusion holes 320 may correspond to the lower support protrusions 120 to be formed in one pair. The power protrusion hole 320 is coupled to the lower support protrusion 120, and may allow the lower support protrusion 120 to be coupled from an upper portion to a lower portion so as to protrude downward.

The fixed connector 330 is coupled to the power supply board and may be electrically connected to the power supply board. The fixed connector 330 supplies power supplied from the outside to the power supply board 300 to allow power to be supplied to the VCSEL device 220. The fixed connector 330 may be electrically connected to various electrical conductive patterns formed on the power supply board 300. As the fixed connector 330, a conventional connector used for the substrate may be employed. The plurality of fixed connectors 330 may be provided according to the area of the power supply board 300, the number of the VCSEL devices 220, and an arrangement relationship.

The connecting connector 340 is detachably coupled to the fixed connector 330 and may be electrically connected to the fixed connector 330. The connecting connector 340 may supply the power supplied from the outside to the fixed connector 330. As the connecting connector 340, a conventional connector used for the substrate may be employed.

The electrode terminal 400 may include an upper terminal bolt 410, a lower terminal bolt 420, a connecting nut 430, and an insulating tube 440.

The electrode terminal 400 electrically connects the VCSEL module 200 and the power supply board 300 while being inserted into the module support plate 100 from an upper portion of the VCSEL module 200 and a lower portion of the power supply board 300. In addition, the electrode terminal 400 independently secures each VCSEL module 200 to the module support plate 100. Furthermore, since the electrode terminal 400 is coupled in a bolt-nut manner, it is easy to couple and detach the electrode terminal. Therefore, when the specific VCSEL module 200 is broken-out, the VCSEL module 200 can be replaced by detaching only the electrode terminal 400 securing the VCSEL module 200 in question.

The upper terminal bolt 410 may be formed of a conventional bolt provided with an upper body part with a threaded part formed on a lower portion thereof and an upper head part coupled to an upper portion of the upper body part. In the upper terminal bolt 410, the upper body part passes through the device terminal hole 211 and the block terminal hole 241 of the VC SEL module 200 and is then inserted into the support terminal hole 111. Accordingly, the upper body part of the upper terminal bolt 410 may be formed with a length such that the threaded part formed on the lower portion may be positioned at an appropriate position in the support terminal hole 111 of the module support plate 100.

The upper terminal bolt 410 may be formed of an electrically conductive material. For example, the upper terminal bolt 410 may be formed of a metal material. The upper terminal bolt 410 may be formed of stainless steel, copper, or aluminum. The upper terminal bolt 410 may be electrically connected to the terminal pad 230. More specifically, a lower surface of the upper part is seated on the upper surface of the device substrate 210 of the VCSEL module 200, and may be electrically connected to the terminal pad 230. The upper head part comes in direct in contact with an upper surface of the terminal pad 230. Accordingly, the upper terminal bolt 410 is electrically connected to the VCSEL device 220 via the terminal pad 230.

The lower terminal bolt 420 may be formed of a general bolt having a lower body part with a threaded part formed on a lower portion thereof and a lower head part coupled to an upper portion of the lower body part. The lower terminal bolt 420 may be formed of the same bolt as the upper terminal bolt 410. However, since the lower terminal bolt 420 is inserted from the lower side into the module support plate 100 through the power supply board 300 having a relatively thin thickness, the length of the lower terminal bolt may be relatively short. The lower terminal bolt 420 may be formed of an electrically conductive material. For example, the lower terminal bolt 420 may be formed of a metal material. The lower terminal bolt 420 may be formed of stainless steel, copper, or aluminum.

The lower body part of the lower terminal bolt 420 passes through the power terminal hole 310 of the power supply board 300 and is then inserted into the support terminal hole 111. The lower terminal bolt 420 may be electrically connected to the power supply board 300. More specifically, a lower surface of the lower head part may come in contact with the lower surface of the power supply board 300. Accordingly, the lower terminal bolt 420 may be electrically connected to the electrically conductive pad formed on the lower surface of the power supply board 300. Accordingly, the lower terminal bolt 420 may supply power, which is being supplied to the power supply board 300, to the upper terminal bolt 410.

The connecting nut 430 has a tube shape with opened upper and lower end portions, and a threaded part may be formed as a whole on an inner circumferential surface thereof. The connecting nut 430 may be formed with a length longer than at least half of the thickness of the module support plate 100. In addition, the connecting nut 430 is formed to have an outer diameter smaller than an inner diameter of the support terminal hole 111. The connecting nut 430 is inserted into the support terminal hole 111. The connecting nut 430 may be positioned inside the support terminal hole 111 so that its lower end portion coincides with a lower end portion of the support terminal hole 111. The connecting nut 430 may be inserted so that its upper end portion comes to a position higher than half of the height of the support terminal hole 111.

Therefore, the connecting nut 430 is positioned inside the support terminal hole 111, the upper terminal bolt 410 is screw-coupled to the upper portion of the connecting nut and the lower terminal bolt 420 is screw-coupled to the lower portion. The connecting nut 430 may be formed with a length which is necessary for screw-coupling the upper terminal bolt 410 and the lower terminal bolt 420 thereto. The connecting nut 430 may be formed of an electrically conductive material. For example, the connecting nut 430 may be formed of a metal material. The connecting nut 430 may be formed of stainless steel, copper, or aluminum.

While, the connecting nut 430 is screw-coupled with the upper terminal bolt 410 and the lower terminal bolt 420, the upper head part of the upper terminal bolt 410 is pressed against the terminal pad 230 of the VCSEL module 200 and the lower head part of the lower terminal bolt 420 is pressed against the lower surface of the power supply board. In addition, since the connecting nut 430 is screw-coupled with the upper terminal bolt 410 and the lower terminal bolt 420, the upper terminal bolt 410 or the lower terminal bolt 420 can be more easily detached. In addition, the connecting nut 430 electrically connects the upper terminal bolt 410 and the lower terminal bolt 420.

The insulating tube 440 may be formed in a tube shape in which an inner circumferential surface corresponds to an outer circumferential surface of the connecting nut 430. The insulating tube 440 is formed of electric insulator. For example, the insulating tube 440 may be formed of a resin material. The insulating tube 440 is placed between an outer circumferential surface of the connecting nut 430 and an inner circumferential surface of the support terminal hole 111 to electrically insulate the connecting nut 430 and the module support plate 100. In addition, the insulating tube 440 is placed between an outer circumferential surface of the upper terminal bolt 410, which is exposed to the upper portion of the connecting nut 430, and an inner circumferential surface of the support terminal hole 111 to electrically insulate the upper terminal bolt 410 and the module support plate 100. In this case, the insulating tube 440 may be formed such that a portion thereof which is in contact with the insulating support ring has a relatively small diameter.

The coolant supply module 500 may include a coolant supply main body 510, a coolant inflow pipe 520 and a coolant outflow pipe 530.

The coolant supply module 500 is placed below the power supply board, and may supply coolant to the module support plate 100 and the VCSEL module 200. The coolant supply module 500 supplies coolant, which is supplied into the coolant supply main body 510 via the coolant inflow pipe 520, to the module support plate 100 and the VCSEL module 200. In addition, the coolant supply module 500 discharges the coolant, which inflows thereinto from the module support plate 100 and the VCSEL module 200, to the outside through the coolant outflow pipe 530.

The coolant supply module 500 may be placed below the module support plate 100. The coolant supply module 500 may be coupled to the support lower protrusion 120 of the module support plate 100 to supply coolant, which is supplied from the outside, to the module support plate 100 via the protrusion coolant hole 121.

In addition, the coolant supply module 500 may be formed in a state in which the coolant supply main body 510 is separated into a plurality of unit supply bodies in a horizontal direction. In this case, in the coolant supply module 500, the coolant inflow pipe 520 and the coolant outflow pipe 530 may also be coupled to each unit supply main body.

The coolant supply main body 510 may include a main body internal flow passage 511, a main body upper flow passage 512, and a main body lower flow passage 513. In addition, the coolant supply main body 510 may further include a main body connecting flow passage 514 and a connector hole 515.

The coolant supply main body 510 may be formed in a planar shape corresponding to that of the module supporting plate 100. The coolant supply main body 510 may be formed in a circular plate shape having a predetermined thickness. The coolant supply main body 510 may be formed by combining an upper plate and a lower plate to form a flow passage therein. In the coolant supply main body 510, more specifically, a groove having a vertical cross-section, which corresponds to half of the vertical cross-section of the main body internal flow passage 511, is formed in each of the upper and lower plates, so a flow passage may be formed by coupling the upper plate and the lower plate.

In addition, the coolant supply main body 510 may be separated into a plurality of unit supply bodies along a horizontal plane. In this case, in the unit supply main body, the main body internal flow passage 511, the main body upper flow passage 512, and the main body lower flow passage 513 may be independently formed. Therefore, since the unit supply main body cools a relatively small number of VCSEL modules 200, it is possible to cool the VCSEL modules 200 more efficiently.

Meanwhile, in the following description, the direction and position will be described based on the state in which the coolant supply main body is placed below the module support plate 100.

The main body internal flow passage 511 is formed to be extended horizontally in the x-axial direction or the y-axial direction within the coolant supply main body 510. Two main body internal flow passages 511 extending in parallel to each other may be formed in pairs. In addition, the main body internal flow passage 511 may be formed in one pair or a plurality of pairs according to the area of the unit supply main body. That is, at least one pair of the main body internal flow passages 511 may be formed. The main body internal flow passages 511 are extended in the arrangement direction of the VCSEL devices 220 of the VCSEL module 200 placed thereabove. For example, the main body internal flow passage 511 may be extended in the x-axial direction or the y-axial direction. In addition, the main body internal flow passage 511 is extended along the lower portion of the protrusion coolant hole 121 of the module support plate 100. At this time, the main body internal flow passages 511 are formed in one pair, and may be extended along the lower portions of one pair of protrusion coolant holes 121. The main body internal flow passage 511 may provide a passage through which coolant outflowing to the protrusion coolant hole 121 flows, and a passage through which coolant inflowing from the protrusion coolant hole 121 flows.

The main body upper flow passage 512 is formed by penetrating the coolant supply main body 510 from the main body internal flow passage 511 to an upper surface of the coolant supply main body. The plurality of main body upper flow passages 512 may be formed to be spaced apart from each other in the extension direction of the main body internal flow passage 511. That is, the main body upper flow passages 512 may be formed to be spaced apart from each other in the arrangement direction of the VCSEL devices 220. The main body upper flow passages 512 may be formed in a number corresponding to the number of protrusion coolant holes 121. In addition, the main body upper flow passages 512 may be formed at the main body internal flow passages 511, respectively, which are formed in one pair, to be formed in one pair with the main body internal flow passages. In addition, the body upper channel 512 may be formed in at least one pair to correspond to the body internal channel 511. The main body upper flow passages 512 may be coupled respectively to lower ends of the protrusion coolant holes 121 below the protrusion coolant hole 121. Accordingly, the main body upper flow passage 512 may independently supply coolant to each VCSEL module 200. In addition, the main body upper flow passage 512 forming a pair with the main body upper flow passage 512 supplying coolant allows coolant, which has been supplied to the VCSEL module 200, to inflow again through the module support plate 100.

The main body upper flow passage 512 connects the protrusion coolant hole 121 and the main body internal flow passage 511, and may provide a passage through which coolant in the main body internal flow passage 511 flows to the protrusion coolant hole 121. In addition, the main body upper flow passage 512 may provide a passage through which coolant inflows from the protrusion coolant hole 121 to the main body internal flow passage 511.

The main body lower flow passage 513 is formed by penetrating the coolant supply main body from the main body internal flow passage 511 to a lower surface of the coolant supply main body 510. The main body lower flow passage 513 may be formed at one end or the other end of the main body internal flow passage 511. Unlike the main body upper flow passage 512, the main body lower flow passage 513 may be formed one by one for each main body internal flow passage 511. In addition, the main body upper flow passages 512 may be formed at the main body internal flow passages 511, respectively, which are formed in one pair, to be formed in one pair with the main body internal flow passages.

The main body lower flow passage 513 may connect the main body internal flow passage 511 and the coolant inflow pipe 520 or the coolant outflow pipe 530. Accordingly, the main body lower flow passage 513 provides a passage through which coolant in the coolant inflow pipe 520 inflows to the main body internal flow passage 511. In addition, the main body lower flow passage 513 provides a passage through which coolant in the main body internal flow passage 511 outflows to the coolant outflow pipe 530.

In addition, when the coolant supply main body 510 is formed of a plurality of unit supply main bodies, the main body lower flow passages 513 may be formed in one pair in each unit supply main body.

The main body connecting flow passage 514 is extended in a horizontal direction inside the coolant supply main body 510, and is formed to be extended in a direction perpendicular to the extension direction of the main body internal flow passage 511 or in a direction inclined at a predetermined angle with respect to the above extension direction. The main body connecting flow passage 514 connects the main body internal flow passages 511 to each other and provides a passage through which coolant flows. The main body connecting flow passages 514 are formed in one pair, one of these main body connecting flow passages connects the main body internal flow passage 511 through which coolant outflows to the VCSEL device 220, among the main body internal flow passages 511, and the other one connects the main body internal flow passage 511 through which coolant inflows from the VCSEL device 220, among the main body internal flow passages 511.

The main body connecting flow passage 514 allows coolant supplied to the main body internal flow passage 511 connected to the main body lower flow passage 513 to be supplied to the main body internal flow passage 511 which is not connected to the main body lower flow passage 513.

In addition, when the coolant supply main body 510 is formed of a plurality of unit supply main bodies, the main body connecting flow passage 514 may be formed in each unit supply main body. In the case where the main body internal flow passages 511 are formed as one pair in the unit supply main body, the main body connecting flow passage 514 may not be formed. When the main body internal flow passages 511 are formed in two pairs in the unit supply main body, the main body connecting flow passages 514 are formed in one pair.

The main body connecting flow passage 514 may connect the main body internal flow passages 511 through which coolant outflows to the VCSEL device 220 and the main body internal flow passages 511 through which coolant inflows from the VCSEL device 220, respectively. In addition, the main body connecting flow passages 514 may connect the main body internal flow passages 511 at ends opposite to each other, respectively. Accordingly, the main body connecting flow passage 514 may enable the coolant flowing through the main body internal flow passage 511 to entirely uniformly flow.

The connector hole 515 is formed by penetrating the coolant supply main body 510 from an upper surface to a lower surface, and is formed in a region in which the main body internal flow passage 511 is not formed. The connector hole 515 may provide a space for accommodating the connecting connector 340 connected to a lower portion of the power supply board 300. That is, the connecting connector 340 of the power supply board is accommodated therein when the coolant supply module 500 is coupled to a lower surface of the power supply board.

The coolant inflow pipe 520 may be formed of a conventional metal pipe through which coolant may flow. The coolant inflow pipe 520 may be coupled to the main body lower flow passage 513 of the coolant supply main body 510. The coolant inflow pipe 520 may provide a passage through which coolant is supplied to the main body lower flow passage 513. At this time, the main body lower flow passage 513 may supply coolant to the VCSEL device 220.

The coolant outflow pipe 530 may be formed of a conventional metal pipe through which coolant may flow. The coolant outflow pipe 530 may be coupled to the main body lower flow passage 513 of the coolant supply main body 510. The coolant outflow pipe 530 may provide a passage through which coolant outflows from the main body lower flow passage 513. At this time, the coolant which has been supplied to the VCSEL device 220 may inflow to the main body lower flow passage 513.

Next, the operation of the flat substrate heating apparatus using the VCSEL device according to one embodiment of the present disclosure is described.

In the flat substrate heating apparatus 10 of the present disclosure, the VCSEL module 200 is placed on an upper surface of the module support plate 100, and the power supply board 300 is placed below the module support plate 100. The upper terminal bolt 410 of the electrode terminal 400 passes through the device terminal hole 211 and the block terminal hole 241 of the VCSEL module 200 from an upper side, and is then inserted into the support terminal hole 111 of the module support plate 100. In addition, the connecting nut 430 is first inserted into and positioned inside the module support plate 100. Accordingly, the upper terminal bolt 410 may secure the VCSEL module 200 to the module support plate 100 while being screw-coupled to the connecting nut 430. The VCSEL modules 200 are each independently seated on the module support plate 100, and may be secured to the module support plate 100 by the upper terminal bolts 410, respectively. The lower terminal bolt 420 of the electrode terminal 400 passes through the power terminal hole 310 of the power supply board 300 placed below the module support plate to be screw-coupled with the connecting nut 430 of the support terminal hole 111 of the module support plate 100, thereby securing the power supply board 300 to a lower surface of the module support plate 100. At this time, an upper surface of the power supply board 300 may be spaced apart from a lower surface of the module support plate 100 to allow the plurality of electrical conductive patterns, which are formed on an upper surface, to be electrically insulated from a lower surface of the module support plate 100.

Since the upper terminal bolt 410 is electrically connected to the VCSEL module 200, and the lower terminal bolt 420 is electrically connected to the power supply board 300 and is coupled to the connecting nut 430 together with the upper terminal bolt, the electrode terminal 400 may electrically connect the VCSEL module 200 and the power supply board 300. At this time, since the insulating tube 440 is placed between an inner circumferential surface of the support terminal hole 111 of the module support plate 100 and the connecting nut 430, the electrode terminal 400 is not electrically connected to the module support plate 100. The insulating tube 440 may also be placed between the upper terminal bolt 410 and an inner circumferential surface of the support terminal hole 111.

In the flat substrate heating apparatus 10, in addition, coolant supplied from the outside is supplied to the main body lower flow passage 513 of the coolant supply module 500 through the coolant inflow pipe 520 and to the protrusion coolant hole 121 and the support coolant hole 112 of the module support plate 100 through the main body internal flow passage 511 and the main body upper flow passage 512. Coolant may cool heat generated from the VCSEL device 220 while flowing into the block cooling flow passage 242 of the VCSEL module 200 through the support coolant hole 112. Again, coolant outflows to the main body upper flow passage 512 of the coolant supply main body 510 through the support coolant hole 112 and the protruding coolant hole 121 of the module support plate 100, and to the coolant outflow tube 530 through the main body internal flow passage 511. In the flat substrate heating apparatus, therefore, since the flow passage for supplying coolant to each VCSEL module 200 is formed, the broken-down VCSEL module 200 can be independently detached.

In order to help those skilled in the art to understand, the most preferred embodiment is selected from the various implementable embodiments of the present disclosure, and is set forth in the present specification, and the technical spirit of the present disclosure is not necessarily restricted or limited only by these embodiments, and various changes, additions, and modification are possible without departing from the technical spirit of the present disclosure, and implementations of other equivalent embodiments are possible.

The invention claimed is:

1. A flat substrate heating apparatus, comprising:
a module support plate having a plurality of unit module regions placed on an upper surface thereof;
a plurality of VCSEL (Vertical Cavity Surface Emitting Laser) modules having a plurality of laser light source devices and seated on the unit module regions of the module support plate, respectively;
a power supply board placed below the module support plate and configured to supply power to each VCSEL module; and
an electrode terminal electrically connecting each VCSEL module and the power supply board while detachably securing them to upper and lower surfaces of the module support plate,
wherein each VCSEL module further comprises:
a device substrate having a device region and a terminal region, and having a device terminal hole penetrating the terminal region from an upper surface to a lower surface;
a VCSEL device arranged on the device region of the device substrate;
a terminal pad formed in a ring shape along an outer diameter of an upper end of the device terminal hole; and
a cooling block placed below the device substrate and having a block terminal hole,
wherein the module support plate comprises a support main body plate having a support terminal hole formed at a position, corresponding to the device terminal hole, of each unit module region,
wherein the power supply board has a power terminal hole formed at a position corresponding to the support terminal hole,
wherein the electrode terminal comprises an upper terminal bolt passing through the device terminal hole and the block terminal hole to be inserted into an upper portion of the support terminal hole, a lower terminal bolt passing through the power terminal hole to be inserted into a lower portion of the support terminal hole, and a connecting nut placed inside the support terminal hole and screw-coupled with the upper terminal bolt and the lower terminal bolt.

2. The flat substrate heating apparatus of claim 1, wherein the upper terminal bolt is electrically connected to the terminal pad, and the lower terminal bolt is electrically connected to the power supply board.

3. The flat substrate heating apparatus of claim 1, wherein the electrode terminal further comprises an insulating tube placed between an inner circumferential surface of the support terminal hole and an outer circumferential surface of the connecting nut.

4. The flat substrate heating apparatus of claim 1, wherein the support main body plate has a support coolant hole formed by penetrating the support main body plate from an upper surface to a lower surface thereof, wherein the module support plate further comprises a support lower protrusion formed from a lower portion of the support coolant hole to a lower portion of the support main body plate and having a protrusion coolant hole being in communication with the support coolant hole, wherein the cooling block further comprises a block cooling flow passage connected to the support coolant hole, coolant for cooling the VCSEL device flows through the protrusion coolant hole, the support coolant hole and the block cooling flow passage.

5. The flat substrate heating apparatus of claim 4, wherein the flat substrate heating apparatus further comprises a coolant supply module coupled to the support lower protrusion to supply coolant to the protrusion coolant hole, wherein the coolant supply module comprises a coolant supply main body having a planar shape corresponding to the module support plate, a coolant inflow pipe for supplying coolant to the coolant supply main body, and a coolant outflow pipe for outflowing coolant from the coolant supply main body, wherein the coolant supply main body comprises at least one pair of main body internal flow passages extended therein in a direction in which each VCSEL module is arranged, at least one pair of main body upper flow passages formed by penetrating the coolant supply main body from the main body internal flow passage to an upper surface of the coolant supply main body and connected to the protrusion coolant hole, and one pair of main body lower flow passage formed by penetrating the coolant supply main body from the main body internal flow passage to a lower surface of the coolant supply main body, and wherein the coolant inflow pipe and the coolant outflow pipe are coupled to one pair of main body lower flow passages, respectively.

6. The flat substrate heating apparatus of claim 5, wherein the coolant supply main body is formed to be divided into a plurality of unit supply main bodies, and each unit supply main body comprises the main body internal flow passage, the main body upper flow passage and the main body lower flow passage.

7. The flat substrate heating apparatus of claim 5, wherein the coolant supply main body further comprises a main body connecting flow passage connecting the main body internal flow passages when the main body internal flow passage is formed in a plurality of pairs.

* * * * *